United States Patent
Suh et al.

(10) Patent No.: US 7,956,354 B2
(45) Date of Patent: Jun. 7, 2011

(54) METHOD OF MANUFACTURING AN ORGANIC THIN FILM TRANSISTOR, AND AN ORGANIC ELECTROLUMINESCENE DISPLAY DEVICE HAVING THE ORGANIC THIN FILM TRANSISTOR

(75) Inventors: Min-Chul Suh, Gyeonggi-do (KR); Jae-Bon Koo, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 0 days.

(21) Appl. No.: 12/504,312

(22) Filed: Jul. 16, 2009

(65) Prior Publication Data

US 2009/0272969 A1     Nov. 5, 2009

Related U.S. Application Data

(62) Division of application No. 11/378,557, filed on Mar. 16, 2006, now Pat. No. 7,572,668.

(30) Foreign Application Priority Data

Mar. 24, 2005   (KR) .................. 10-2005-0024564

(51) Int. Cl.
*H01L 35/24* (2006.01)
*H01L 51/00* (2006.01)

(52) U.S. Cl. ................. 257/40; 257/53; 257/61; 438/99; 438/106

(58) Field of Classification Search .......... 257/40, 257/53, 61; 438/99, 106, 122, 124, 125
See application file for complete search history.

(56) References Cited

U.S. PATENT DOCUMENTS

| 6,335,539 | B1 | 1/2002 | Dimitrakopoulos et al. |
| 7,452,569 | B2* | 11/2008 | Lee et al. ................ 427/248.1 |
| 7,459,337 | B2 | 12/2008 | Kang et al. |
| 7,572,667 | B2* | 8/2009 | Ryu et al. ........................ 438/99 |
| 7,776,645 | B2* | 8/2010 | Nagayama et al. ............ 438/99 |
| 2004/0104461 | A1 | 6/2004 | Ishihara et al. |
| 2004/0214427 | A1* | 10/2004 | Kloster et al. ............... 438/637 |
| 2005/0116231 | A1 | 6/2005 | Kang et al. |

(Continued)

FOREIGN PATENT DOCUMENTS

JP     2003-092410     3/2003

(Continued)

OTHER PUBLICATIONS

Chinese Office Action for Application No. 2006-10067373.6; Applicant: Samsung Mobile Display Co., Ltd.; dated Sep. 11, 2009; 17 pags; State Intellectual Property Office, P.R. China.

(Continued)

*Primary Examiner* — Phuc T Dang

(74) *Attorney, Agent, or Firm* — Knobbe Martens Olson & Bear LLP

(57) ABSTRACT

Provided is a method of patterning an organic thin film which can prevent surface damage of an organic semiconductor layer. Also, an organic thin film transistor that can reduce an off-current and can prevent surface damage of the organic semiconductor layer and a method of manufacturing the organic thin film transistor, and an organic electroluminescence display device having the organic thin film transistor are provided. The method of patterning the organic thin film includes forming the organic thin film on a substrate, selectively printing a mask material on a portion of the organic thin film, dry etching an exposed portion of the organic thin film using the mask material, and removing the mask material.

6 Claims, 9 Drawing Sheets

U.S. PATENT DOCUMENTS

2006/0054885 A1 * 3/2006 Seo et al. .................. 257/40

FOREIGN PATENT DOCUMENTS

| JP | 2005-072053 | 3/2005 |
| JP | 2006-100808 | 4/2006 |
| KR | 1020040028010 | 4/2004 |
| KR | 1020040084427 | 10/2004 |
| WO | WO 2004/107473 | 12/2004 |
| WO | WO 2004/110105 | 12/2004 |

OTHER PUBLICATIONS

Japanese Office Action for Appl. No. JP 2006-061413; Applicant Samsung Mobile Display Co., Ltd.; dated Jan. 5, 2010; 3 pgs.

* cited by examiner

METHOD OF MANUFACTURING AN ORGANIC THIN FILM TRANSISTOR, AND AN ORGANIC ELECTROLUMINESCENE DISPLAY DEVICE HAVING THE ORGANIC THIN FILM TRANSISTOR

CROSS-REFERENCE TO RELATED APPLICATION

This application is a divisional application of and claims priority to U.S. application Ser. No. 11/378,557 filed on Mar. 16, 2006 U.S. Pat. No. 7,572,668 which claims the benefit of Korean Patent Application No. 10-2005-0024564, filed on Mar. 24, 2005, in the Korean Intellectual Property Office, both of which is incorporated herein in their entirety by reference.

BACKGROUND OF THE INVENTION

1. Field of the Invention

The present embodiments relate to an organic thin film transistor, and more particularly, to a method of patterning an organic thin film which prevents the surface of an organic semiconductor layer from being damaged. The present embodiments also provide an organic thin film transistor and an organic electroluminescence display device having an organic thin film transistor that can prevent surface damage and can reduce an off-current of an organic semiconductor layer and a method of manufacturing the organic thin film transistor.

2. Description of the Related Art

Studies on organic thin film transistors (OTFTs) for use in next generation display devices have been actively performed. OTFTs use an organic film instead of a silicon film as a semiconductor layer, and are classified into low molecule organic thin film transistors using oligothiophene and pentacene, and polymer organic thin film transistors using polythiophene, according to the material for forming the organic film.

An organic electroluminescence display device that uses an organic thin film transistor as a switching device includes at least two organic thin film transistors, for example, one switching organic thin film transistor and one driving organic thin film transistor, one capacitor, and an organic light emitting diode having an organic film layer interposed between upper and lower electrodes.

Typically, a flexible organic electroluminescence display device uses a flexible substrate that includes a plastic substrate. The organic electroluminescence display device that uses the plastic substrate has to be manufactured in a low temperature process since the plastic substrate has very low thermal stability.

Accordingly, an organic thin film transistor that uses an organic film as a semiconductor layer has been largely considered as an alternative for the switching device of the flexible organic electroluminescence display device since the organic thin film transistor can be manufactured in a low temperature process.

A pentacene thin film transistor that can reduce the thin film deposition time and improve the hole mobility has been disclosed in Korea Patent Laid-Open No. 2004-0028010. A device structure of an organic thin film transistor and a method of manufacturing the organic thin film transistor that can improve the electrical performance of the transistor have been disclosed in Korea Patent Publication No. 2004-0084427. Also, a thin film transistor that can improve carrier mobility and on/off current ratio by forming a channel region into an organic compound having a radical has been disclosed in Japanese Laid-Open Patent No. 2003-92410.

FIG. 1 is a cross-sectional view of a conventional organic thin film transistor having a top gate structure.

Referring to FIG. 1, a conventional organic thin film transistor 10 includes a gate electrode 12 formed on a substrate 11, a gate insulating film 13 formed on the substrate 11 including the gate electrode 12, source and drain electrodes 14 and 15 formed on the gate insulating film 13, and a semiconductor layer 16 formed on the source and drain electrodes 14 and 15 and the gate insulating film 13.

In the conventional organic thin film transistor 10 having the above structure, the semiconductor layer 16 includes an organic semiconductor layer, and the un-patterned semiconductor layer 16 is formed on the entire surface of the substrate 11. Therefore, there is a problem of a leakage current due to the accumulation of carriers, for example, holes, between the semiconductor layer 16 and the gate insulating film 13.

To solve the above problem, when the organic semiconductor layer is patterned using an ablation method, as depicted in FIG. 2, thermal denaturation or recasting by a laser can occur at edge portions of the patterned semiconductor layer.

SUMMARY OF THE INVENTION

The present embodiments provide a method of patterning an organic thin film, in which an organic semiconductor layer can be patterned without surface damage of the organic semiconductor layer.

The present embodiments also provide an organic thin film transistor that can reduce an off-current and can prevent the surface of the organic semiconductor layer from being damaged and a method of manufacturing the organic thin film transistor.

Some embodiments relate to a method of patterning an organic thin film, comprising:
forming the organic thin film on a substrate;
selectively printing a mask material on a portion of the organic thin film;
dry etching an exposed portion of the organic thin film using the mask material; and
removing the mask material.

The present embodiments also provide an organic electroluminescence display device having an organic thin film transistor that can reduce an off-current and can prevent the surface of the organic semiconductor layer from being damaged.

According to an aspect of the present embodiments, there is provided a method of patterning an organic thin film, comprising: forming the organic thin film on a substrate; selectively printing a mask material on a portion of the organic thin film; dry etching an exposed portion of the organic thin film using the mask material; and removing the mask material.

The organic thin film comprises an organic semiconductor layer and at least one organic material selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiophene vinylene and its derivatives, thiophene-heterocyclic aromatic copolymer and its derivatives, oligonaphthalene and its derivatives, alpha-5-thiophenyl oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, naphthalene tetracarboxylic acid diimide and its derivatives, and naphthalene tetracarboxylic acid dianhydride and its derivatives.

The organic thin film may be dry etched using an $O_2$ ashing process. The mask material may comprise a low viscosity paraffin wax group or a grease group. The mask material may be removed through a washing process using n-hexane.

According to an aspect of the present embodiments, there is provided a method of manufacturing a thin film transistor, comprising: forming source and drain electrodes on a substrate; forming an organic semiconductor layer on the source and drain electrodes and the substrate; selectively printing a mask material on a portion of the organic semiconductor layer; patterning the organic semiconductor layer by a dry etching method using the mask material; forming a gate insulating film on the substrate; and forming a gate electrode on the gate insulating film.

According to an aspect of the present embodiments, there is provided a method of manufacturing a thin film transistor, comprising: forming a gate electrode on a substrate; forming a gate insulating film on the substrate; forming source and drain electrodes on the gate insulating film; forming an organic semiconductor layer on the substrate; selectively forming a mask material on a portion of the organic semiconductor layer; and patterning the organic semiconductor layer by a dry etching method using the mask material.

According to another aspect of the present embodiments, there is provided an organic thin film transistor manufactured according to the method described above and a flat display device having the organic thin film transistor.

The flat display device may comprise a plurality of pixels arranged in a matrix in rows and columns, each of the pixels having at least one organic thin film transistor, wherein the organic thin film transistor comprises one or more gate electrodes, one or more source electrodes and one or more drain electrodes, and a semiconductor layer, and the semiconductor layer has a box shape, a line shape extended in a row or column direction, or a mesh shape extended in row and column directions corresponding to at least the source and drain electrodes and a portion between the source and drain electrodes.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described more fully with reference to the accompanying drawings in which exemplary embodiments are shown.

FIGS. 3A through 3D are cross-sectional views for demonstrating a method of patterning an organic thin film transistor according to an embodiment.

Figure 1:
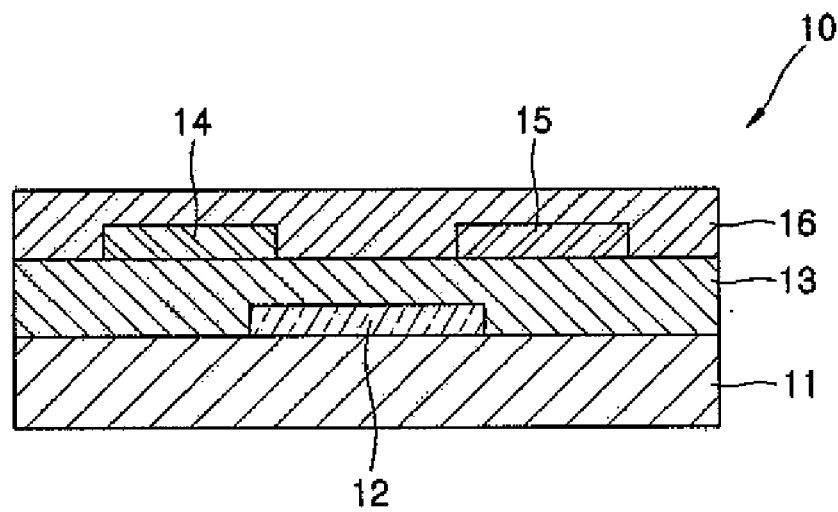
FIG. 1 is a cross-sectional view of a conventional organic thin film transistor.
Figure 2:
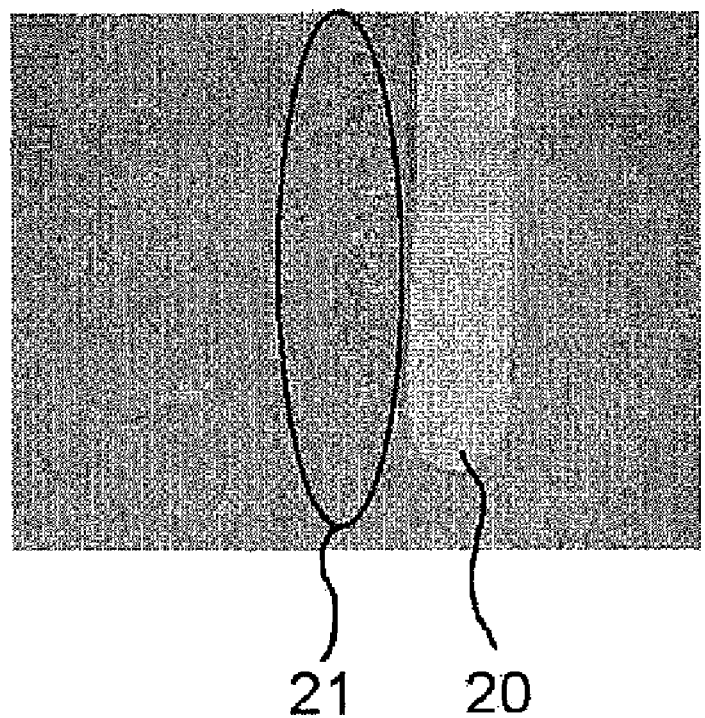
FIG. 2 is a SEM (scanning electron microscope) image showing the surface damage of an organic semiconductor layer in a conventional organic thin film transistor when the organic semiconductor layer is patterned using a laser ablation method.
Figure 3A:
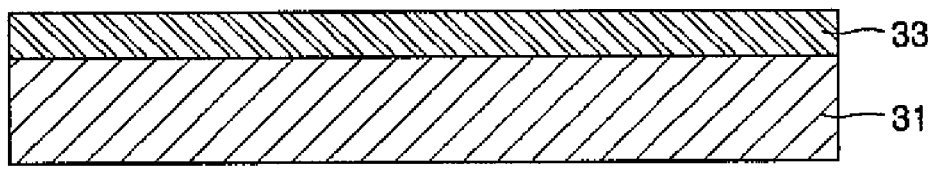
FIGS. 3A through 3D are cross-sectional views for explaining a method of patterning an organic thin film transistor according to an embodiment.

Referring to FIG. 3A, an organic thin film 33 is formed on a substrate 31. The substrate 31 may include a plastic substrate and the organic thin film 33 may include an organic semiconductor layer.

The substrate 31 includes a plastic film selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

The organic semiconductor layer 33 includes at least one organic film selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiophene vinylene and its derivatives, thiophene-heterocyclic aromatic copolymer and its derivatives, oligonaphthalene and its derivatives, alpha-5-thiophenyl oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, naphthalene tetracarboxylic acid diimide and its derivatives, and naphthalene tetracarboxylic acid dianhydride and its derivatives.

Figure 3B:
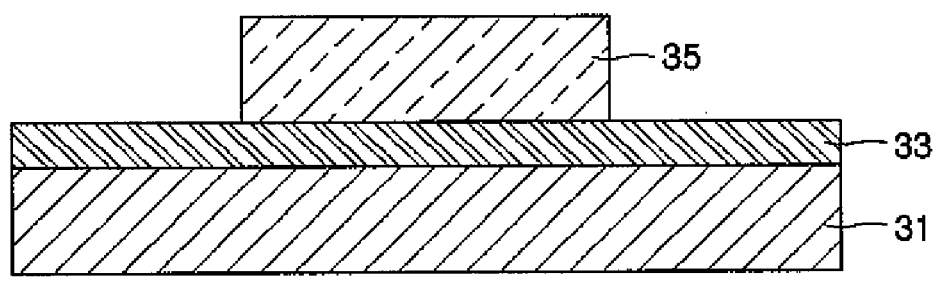
Figure 3C:
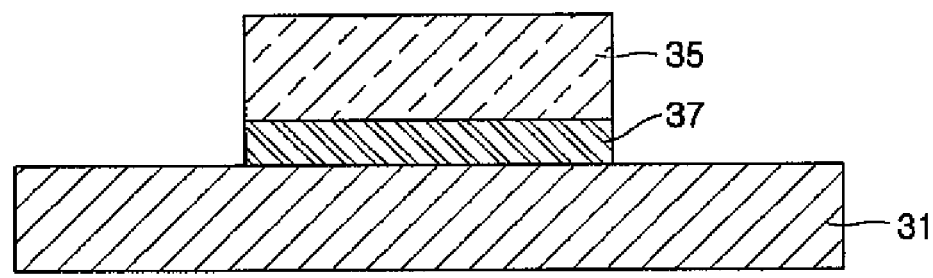

Referring to FIG. 3B and FIG. 3C, a mask material 35 is selectively printed on the organic thin film 33. The mask material 35 may have a thickness in consideration of the thickness and etching rate of the organic film during a subsequent dry etching process for patterning the organic film. The mask material 35 can be formed of a material group, such as a low viscosity paraffin wax or grease, and can be selectively formed on desired portions of the organic thin film 33.

Figure 3D:
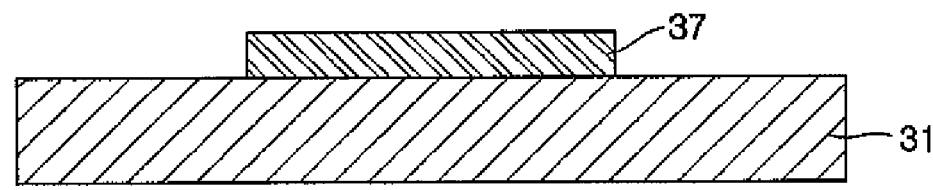

The organic thin film 33 is patterned by etching exposed portions of the organic thin film 33 using the mask material 35. At this time, the organic thin film 33 is etched by a dry etching method using an $O_2$ ashing process. Referring to FIG. 3D, an organic thin film pattern 37 is formed by removing the mask material 35 through a cleaning process using n-hexane.

In the present embodiment, the organic semiconductor layer is patterned by a dry etching method using the mask material, such as wax or grease group, but the present embodiments not limited thereto. That is, various organic materials can be patterned by the dry etching method using wax or grease group as the mask material.

Figure 4:
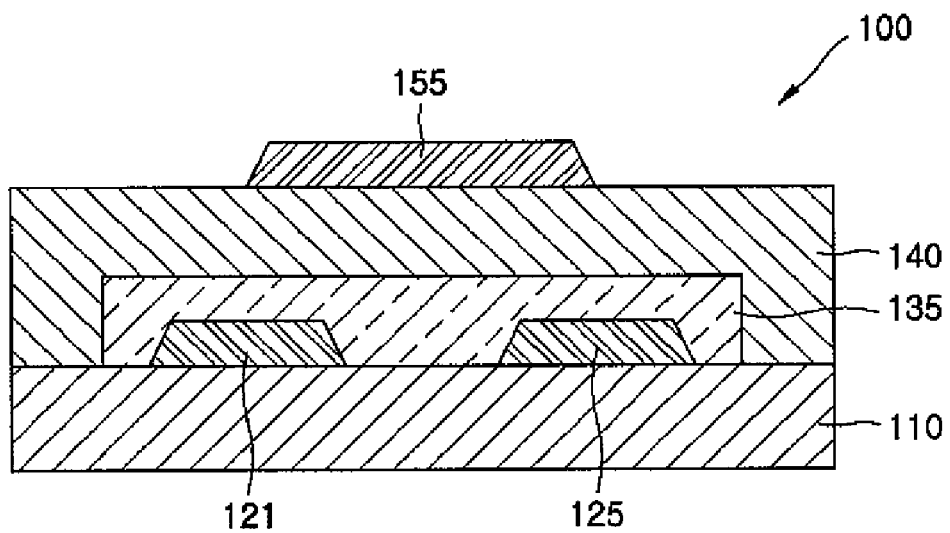
FIG. 4 is a cross-sectional view illustrating an organic thin film transistor according to an embodiment.

FIG. 4 is a cross-sectional view illustrating an organic thin film transistor used for a flexible organic electroluminescence display device according to an embodiment. The organic thin film transistor 100 according to an embodiment has a top gate structure.

Referring to FIG. 4, the organic thin film transistor 100 includes source and drain electrodes 121 and 125 formed on a substrate 110. A semiconductor layer 135 is formed on the substrate 110. A portion of the semiconductor layer 135 between the source and drain electrodes 121 and 125 serves as a channel layer. Preferably, the substrate 110 includes a plastic substrate, and the semiconductor layer 135 includes an organic semiconductor layer.

A gate insulating film 140 is formed on the substrate 110 and the semiconductor layer 135. A gate electrode 155 is formed on the gate insulating film 140 corresponding to the channel layer of the semiconductor layer 135 located between the source and drain electrodes 121 and 125.

The substrate 110 includes a plastic film selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

The gate insulating film 140 can be configured into a single layer or multi-layer films of an organic insulating film or an inorganic insulating film or an organic-inorganic hybrid film. The insulating film 140 includes an inorganic insulating film, such as $SiO_2$, $SiN_x$, $Al_2O_3$, $Ta_2O_5$, BST (barium strontium titanate), and PZT (lead zirconate titanate), or an organic insulating film, such as BCB (benzo-cyclo-butene), polyimide, parylene, and polyvinylphenol (PVP).

The semiconductor layer 135 includes at least one organic film selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiophene vinylene and its derivatives, thiophene-heterocyclic aromatic copolymer and its derivatives, oligonaphthalene and its derivatives, alpha-5-thiophenyl oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, naphthalene tetracarboxylic acid diimide and its derivatives, and naphthalene tetracarboxylic acid dianhydride and its derivatives.

The semiconductor layer 135 is patterned in a region corresponding at least to a portion between the source and drain electrodes 121 and 125. FIGS. 6A through 6D are plan views illustrating a pattern of a semiconductor layer 135 in an organic thin film transistor of an organic electroluminescence display device according to an embodiment.

FIGS. 6A through 6D show a thin film transistor connected to a gate line 101 and a data line 103 of thin film transistors that constitute one pixel of an organic electroluminescence display device. The present embodiment shows an example of using a thin film transistor for making a pixel, but the present embodiments are not limited thereto. That is, the present embodiment can be applied to any thin film transistors used for organic electroluminescence display devices.

Figure 6A:
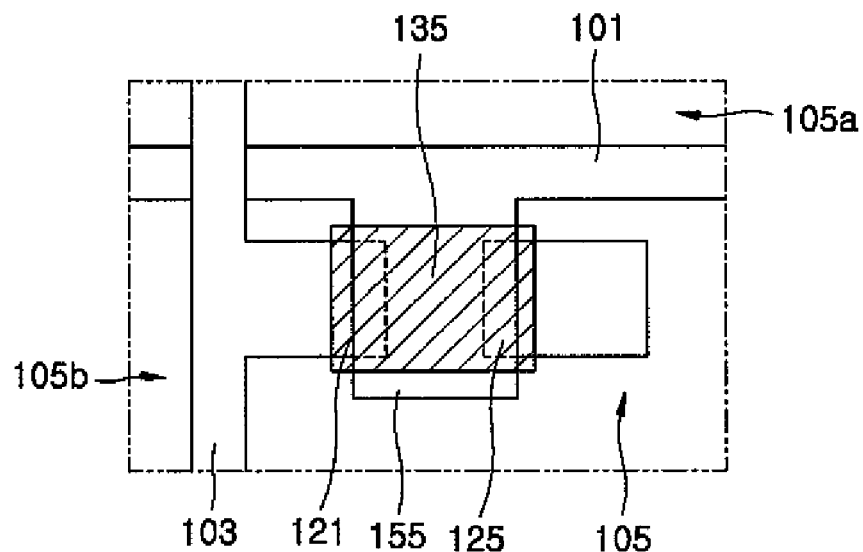
FIGS. 6A through 6D are plan views illustrating a pattern of an organic semiconductor layer in an organic thin film transistor of an organic electroluminescence display device according to an embodiment.

Referring to FIG. 6A, the semiconductor layer 135 is individually arranged in each pixel region 105 defined by the gate line 101 and the data line 103, and a power supply line (not shown), and has a box pattern corresponding at least to the source and drain electrodes 121 and 125 and a portion between the source and drain electrodes 121 and 125.

At this time, the semiconductor layer 135 is arranged in each of the pixel regions, and can have a separated pattern respectively corresponding to a plurality of thin film transistors arranged in each of the pixel regions or can have a separated pattern corresponding to a plurality of thin film transistors arranged in each of the pixel regions.

As another example, the semiconductor layer 135 can be formed in a box shape by overlapping with the gate line 101 and the data line 103 outside of the corresponding pixel region 105 or can be formed over a neighboring pixel region 105a to be separated from a thin film transistor arranged in the neighboring pixel region 105a.

Figure 6B:
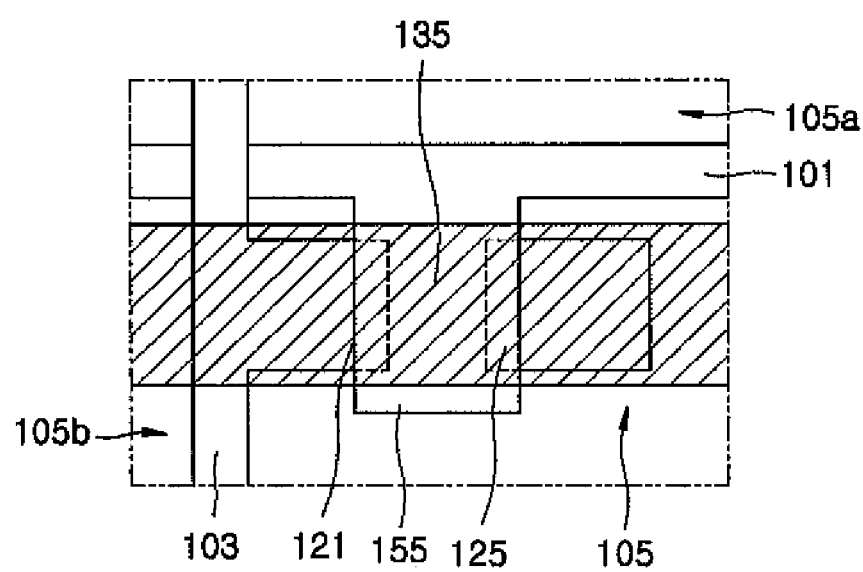

Referring to FIG. 6B, the semiconductor layer 135 has a line shape extended to correspond to the pixel region arranged in a row direction of a plurality of pixel regions defined by the gate line 101 and the data line 103. The semiconductor layer 135 is formed to separate from the thin film transistors arranged in the pixel regions 105a arranged in the neighboring rows of a plurality of pixel regions.

When a plurality of thin film transistors are arranged in the pixel region arranged in the row direction, the semiconductor layer 135 can have a line shaped pattern, separated to respectively correspond to the plural thin film transistors or can have a line shaped pattern corresponding to the plural thin film transistors.

As another example, the semiconductor layer 135 is formed in a line shape by overlapping with the gate line 101 or is formed in a line pattern formed extending along the gate line 101 over the neighboring pixel region 105a outside of the pixel region 105.

Figure 6C:
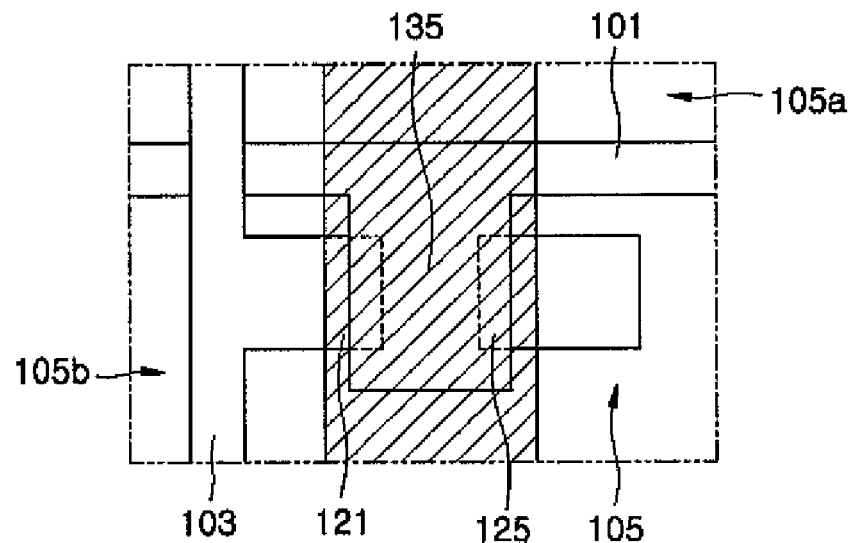

Referring to FIG. 6C, the semiconductor layer 135 has a line shape extended corresponding to the pixel regions arranged in a column direction of a plurality of pixel regions defined by the gate line 101 and the data line 103. The semiconductor layer 135 is formed to separate from the thin film transistors arranged in the pixel regions 105a arranged in the neighboring columns of a plurality of pixel regions.

Also, when a plurality of thin film transistors are arranged in the pixel regions arranged in the column direction, the semiconductor layer 135 can have a line shaped pattern separated to respectively correspond to the plural thin film transistors or can have a line shaped pattern corresponding to the plural thin film transistors.

As another example, the semiconductor layer 135 is formed to overlap with the data line 103 outside of the pixel region 105 or formed in a line pattern formed extending along the data line 103 over the neighboring pixel regions 105a.

Figure 6D:
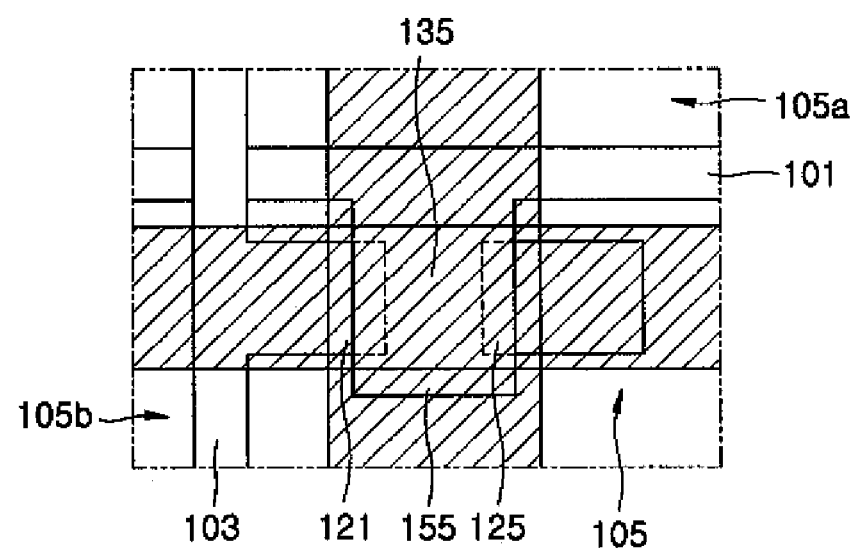

Referring to FIG. 6D, the semiconductor layer 135 has a mesh shape extended to correspond to pixel regions arranged in row and column directions of a plurality of pixel regions defined by the gate line 101 and the data line 103. The semiconductor layer 135 is formed along the data line 103 and the gate line 101 on a portion corresponding to the plural pixel regions.

Also, when a plurality of thin film transistors are arranged in the pixel region arranged in a row direction, the semiconductor layer 135 can have a pattern separated to respectively correspond to the plural thin film transistors or can have a pattern corresponding to the plural thin film transistors.

As another example, the semiconductor layer 135 is formed to overlap with the gate line 101 and/or the data line 103 outside of the pixel region 105 or has a mesh shaped pattern formed extending along the gate line 101 and the data line 103 over the neighboring pixel regions 105a.

FIGS. 5A through 5D are cross-sectional views for explaining a method of manufacturing an organic thin film transistor having a top gate structure according to an embodiment.

Figure 5A:
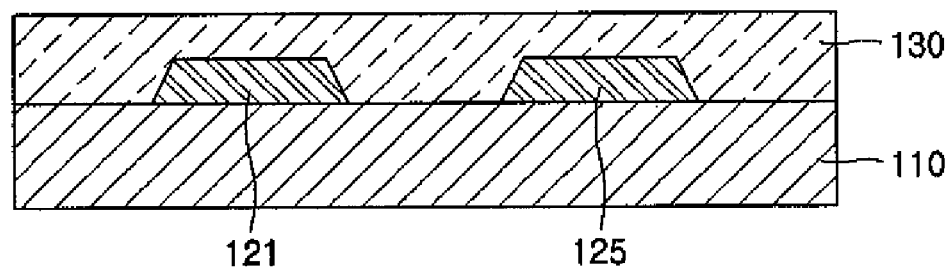
FIGS. 5A through 5D are cross-sectional views for explaining a method of manufacturing an organic thin film transistor according to an embodiment.
Figure 5B:
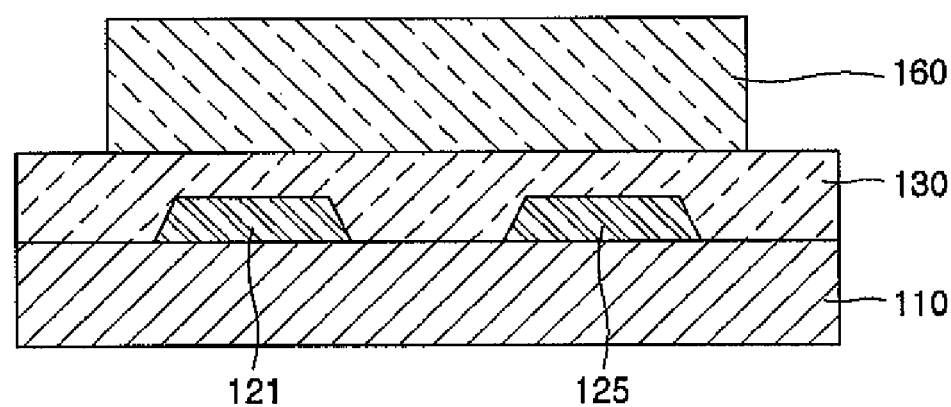
Figure 5C:
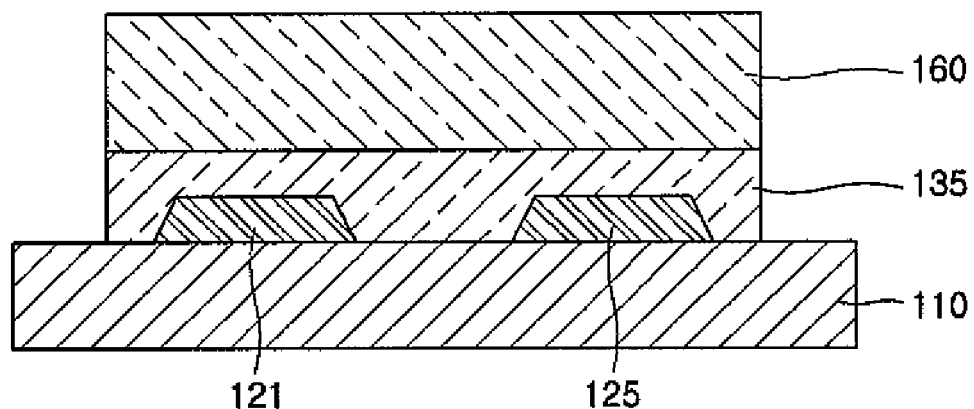

Referring to FIG. 5A, the source and drain electrodes 121 and 125 are formed on the plastic substrate 110, and an organic semiconductor layer 130 covering the source and drain electrodes 121 and 125 is formed on the entire surface of the substrate 110. Referring to FIG. 5B and FIG. 5C, a mask material 160 is selectively formed on a portion of the organic semiconductor layer 130 corresponding to the source and drain electrodes 121 and 125 and a portion between the source and drain electrodes 121 and 125. The mask material 160 includes a low viscosity paraffin wax or a grease group.

Referring to FIG. 5C, the exposed portion of the semiconductor layer 130 is dry etched by an $O_2$ ashing process using the mask material 160. The mask material 160 is formed to a thickness in consideration of the etching rate and the thickness of the exposed portion of semiconductor layer 130 since the organic semiconductor layer 130 must be etched except for the portion 135 under the mask material 160.

Figure 5D:
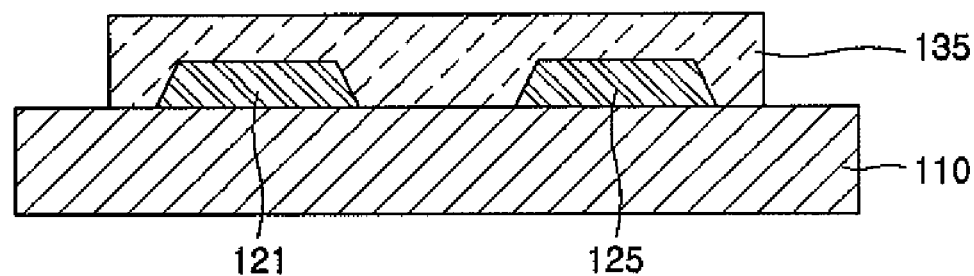

Referring to FIG. 5D, the mask material 160 (not shown) is removed through a cleaning process using n-hexane. Then, the patterned organic semiconductor layer 135 is completed. At this time, the patterned organic semiconductor layer 135 has the same pattern as depicted in FIGS. 6A through 6D.

According to one embodiment the surface damage of the organic semiconductor layer by laser can be prevented and an off-current of the transistor can be reduced by preventing the accumulation of carriers since the semiconductor layer is patterned through the dry etching process and not by a laser ablation method (LAT).

Figure 7:
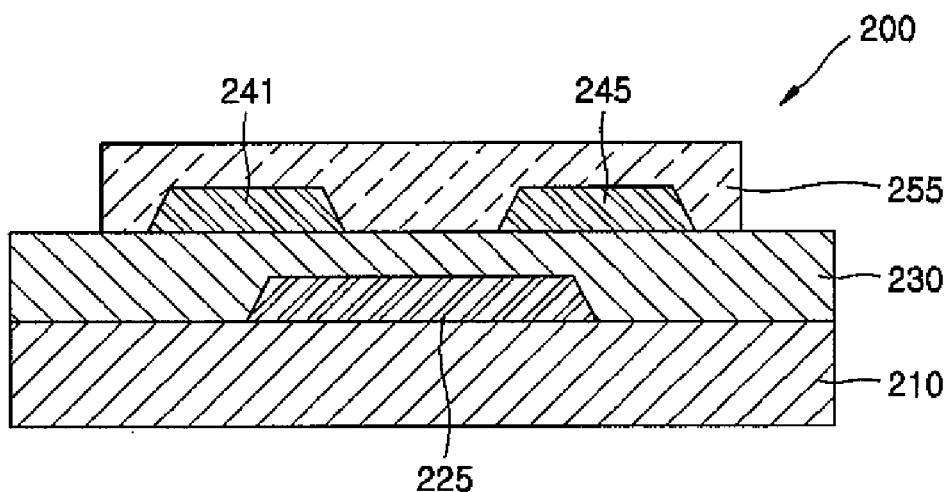
FIG. 7 is a cross-sectional view illustrating an organic thin film transistor according to another embodiment.

FIG. 7 is a cross-sectional view illustrating an organic thin film transistor used for a flexible organic electroluminescence display device according to another embodiment. The organic thin film transistor 200 according to another embodiment has a bottom gate structure.

Referring to FIG. 7, a gate electrode 225 is formed on a substrate 210, and a gate insulating film 230 is formed on the gate electrode 225 and the substrate 210. Source and drain electrodes 241 and 245 are formed on the gate insulating film 230, and a semiconductor layer 255 is formed on the gate insulating film 230 corresponding the source and drain electrodes 241 and 245 and a portion between the source and drain electrodes 241 and 245. The semiconductor layer 255 has various shapes of pattern as depicted in FIGS. 6A through 6D.

The substrate 210 can be a plastic substrate, and includes a plastic film selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

The gate insulating film 230 can be configured into a single layer or multi-layer films of an organic insulating film or an inorganic insulating film or an organic-inorganic hybrid film. The insulating film 230 includes an inorganic insulating film, such as $SiO_2$, $SiN_x$, $Al_2O_3$, $Ta_2O_5$, BST, and PZT, or an organic insulating film, such as BCB, polyimide, parylene, and polyvinylphenol (PVP).

The semiconductor layer 255 includes an organic semiconductor layer, and the semiconductor layer 255 includes at least one organic film selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiophene vinylene and its derivatives, thiophene-heterocyclic aromatic copolymer and its derivatives, oligonaphthalene and its derivatives, alpha-5-thiophenyl oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, naphthalene tetracarboxylic acid diimide and its derivatives, and naphthalene tetracarboxylic acid dianhydride and its derivatives.

FIGS. 8A through 8D are cross-sectional views for explaining a method of manufacturing an organic thin film transistor having a bottom gate structure according to another embodiment.

Figure 8A:
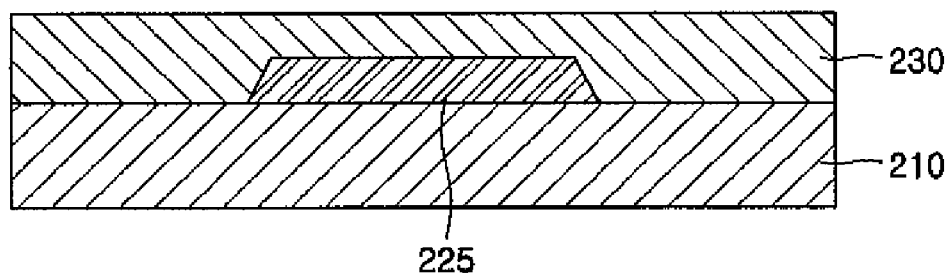
FIGS. 8A through 8D are cross-sectional views for explaining a method of manufacturing an organic thin film transistor according to another embodiment.
Figure 8B:
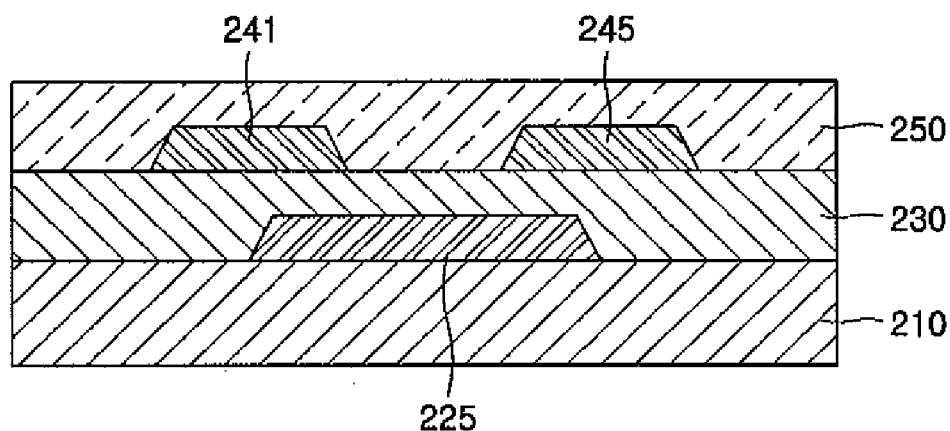

Referring to FIG. 8A, a gate electrode 225 is formed on a plastic substrate 210, and a gate insulating film 230 is formed on the gate electrode 225 and the substrate 210. Referring to FIG. 8B, source and drain electrodes 241 and 245 are formed on the gate insulating film 230. An organic semiconductor layer 250 covering the source and drain electrodes 241 and 245 is formed on the gate insulating film 230.

Figure 8C:
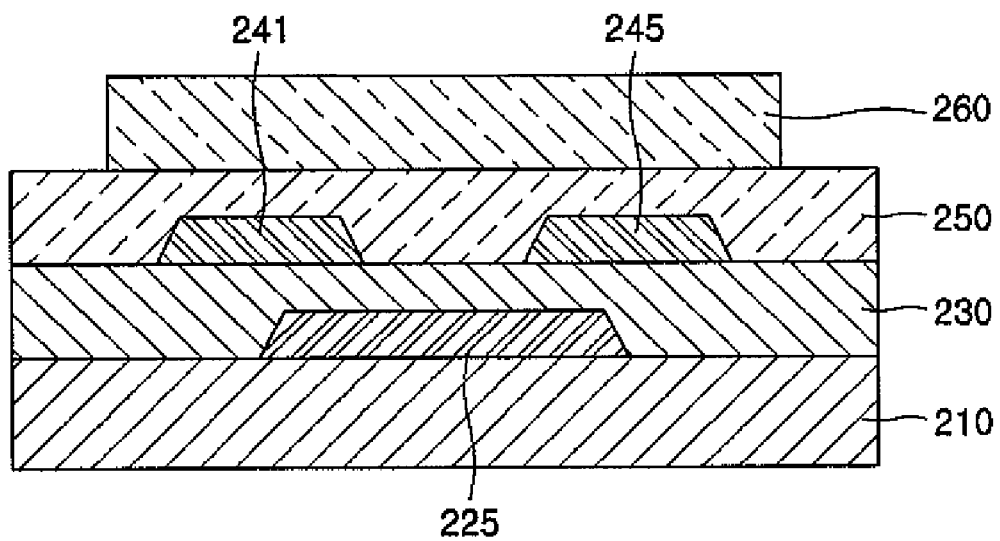

Referring to FIG. 8C, a mask material 260 is selectively printed on the organic semiconductor layer 250. The mask material 260 includes a low viscosity paraffin wax or a grease group, and the mask material 260 is selectively formed on a portion of the organic semiconductor layer that will remain after the organic semiconductor layer is patterned.

Figure 8D:
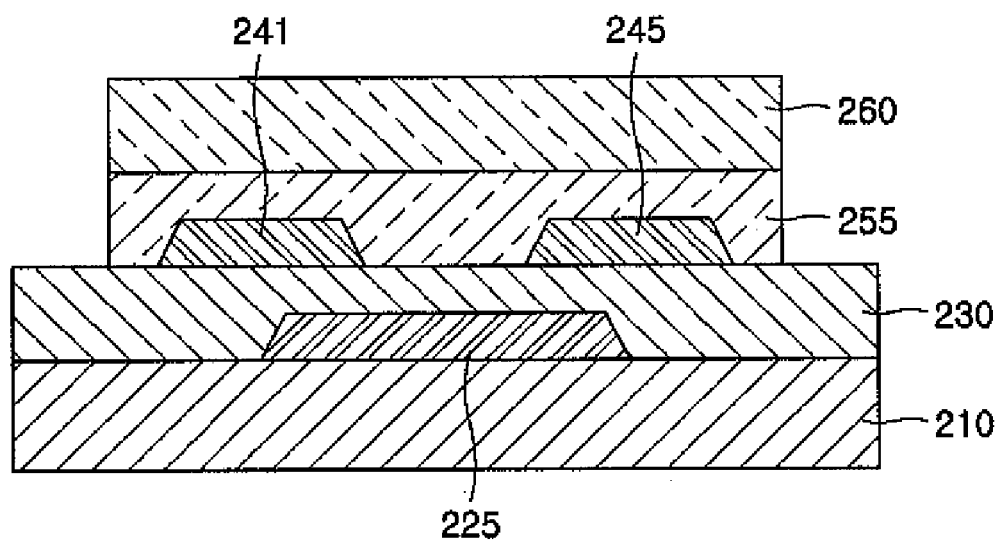

Referring to FIG. 8D, a patterned semiconductor layer 255 is formed by patterning the exposed portion of the organic semiconductor layer 250 of FIG. 8D by a dry etching using an $O_2$ ashing process using the mask material 260. The patterned semiconductor layer 255 is patterned to have the same shape as depicted in FIGS. 6A through 6D. A thin film transistor 200 as depicted in FIG. 7 is formed by removing the remained mask material 260 (not shown) through a cleaning process using n-hexane.

Figure 9:
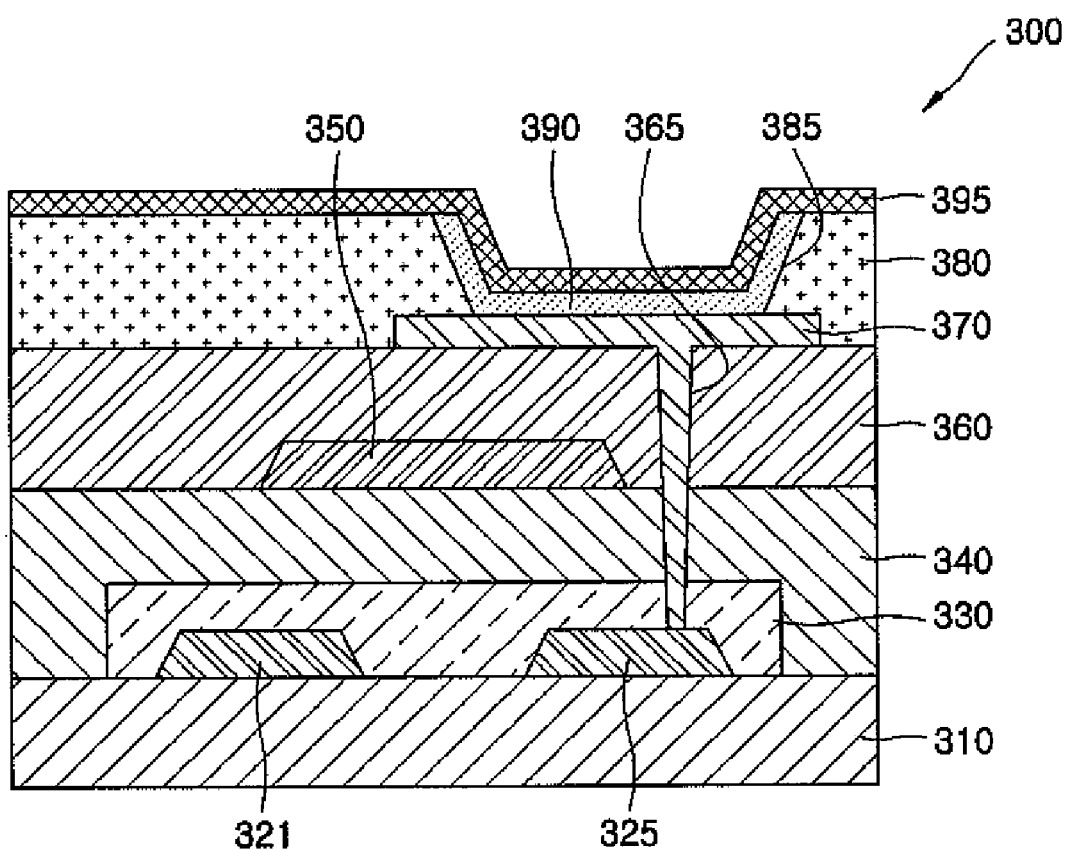
FIG. 9 is a cross-sectional view illustrating an organic electroluminescence display device having an organic thin film transistor according to an embodiment.

FIG. 9 is a cross-sectional view illustrating an organic electroluminescence display device having an organic thin film transistor with a top gate structure according to an embodiment. FIG. 9 is a cross-sectional view of one pixel of the organic electroluminescence display device, which includes an organic electroluminescence diode and a thin film transistor for driving the organic electroluminescence diode of one of the pixels.

Referring to FIG. 9, an organic electroluminescence display device 300 includes source and drain electrodes 321 and 325 formed on a plastic substrate 310. A semiconductor layer 330 is formed on the source and drain electrodes 321 and 325 and the plastic substrate 310. A gate insulating film 340 is formed on the semiconductor layer 330. The semiconductor layer 330 has a pattern as depicted in FIGS. 6A through 6D.

A gate electrode 350 is formed on the gate insulating film 340, and a protection film 360 having a via hole 365 that exposes a portion of one of the source and drain electrodes 321 and 325, for example, the drain electrode 325, is formed on the substrate 310.

A lower electrode 370 which is connected to the drain electrode 325 of the thin film transistor through the via hole 365 is formed on the protection film 360. The lower electrode 370 is an anode electrode and serves as a pixel electrode. A pixel isolation film 380 having an opening 385 that exposes a portion of the lower electrode 370 is formed.

An organic film layer 390 is formed on the lower electrode 370 exposed by the opening 385 of the pixel isolation film 380, and a cathode electrode 395 is formed on the pixel isolation film 380 and the organic film layer 390. The organic film layer 390 includes at least one organic film layer selected from, for example, a hole injection layer, a hole transport layer, a light emitting layer, an electron injection layer, an electron transport layer, and a hole blocking layer etc.

Even though it is not shown, the organic thin film transistor having the bottom gate structure depicted in FIG. 7 can also be applied to an organic electroluminescence display device.

The present embodiments have been described with regard to an organic electroluminescence display device having an organic thin film transistor as a switching device, but the present embodiments can also be applied to a flat display device, such as a liquid crystal device that uses the organic thin film transistor as the switching device. Accordingly, the off-current of the thin film transistor of the flat display device can be reduced and also the surface damage of an organic semiconductor layer of the flat display device can be prevented.

Also, although the present embodiments have been described in conjunction with in a flexible organic electroluminescence display device having a plastic substrate, for which patterning of the semiconductor layer is performed through a dry etching method using a mask material, such as wax, the present embodiments are not limited thereto. That is, the dry etching method using the mask material can be applied to pattern an organic semiconductor layer on a substrate, such as a metal substrate or a glass substrate or can be applied to form an organic thin film transistor.

The organic thin film transistor and the method of manufacturing the organic thin film transistor according to the present embodiment not only prevents the surface damage of the semiconductor layer but also reduces the off-current of the thin film transistor by preventing the leakage current caused by the accumulation of carriers, since the semiconductor layer is formed through a dry etching process with $O_2$ ashing using wax as a mask material.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A flat display device having the organic thin film transistor formed by the following method:
    forming source and drain electrodes on a substrate;
    forming an organic semiconductor layer on the source and drain electrodes and the substrate;
    selectively printing a mask material on a portion of the organic semiconductor layer;
    patterning the organic semiconductor layer by a dry etching method using the mask material;
    forming a gate insulating film on the substrate; and
    forming a gate electrode on the gate insulating film;
    wherein the flat display device comprises a plurality of pixels arranged in a matrix shape having rows and columns, each of the pixels having at least one organic thin film transistor, wherein
    the organic thin film transistor comprises one or more gate electrodes, one or more source electrodes and one or more drain electrodes, and a semiconductor layer, and
    the semiconductor layer has a box shape, a line shape extended in a row or column direction, or a mesh shape extended in row and column directions corresponding to at least the source and drain electrodes and a portion between the source and drain electrodes.

2. The method of claim 1, wherein the substrate comprises a plastic substrate.

3. The method of claim 1, wherein the organic semiconductor layer comprises at least one organic material selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiophene vinylene and its derivatives, thiophene-heterocyclic aromatic copolymer and its derivatives, oligonaphthalene and its derivatives, alpha-5-thiophenyl oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, naphthalene tetracarboxylic acid diimide and its derivatives, and naphthalene tetracarboxylic acid dianhydride and its derivatives.

4. The method of claim 1, wherein the organic semiconductor layer is dry etched through an $O_2$ ashing process.

5. The method of claim 1, wherein the mask material comprises a low viscosity paraffin wax group or a grease group.

6. The method of claim 1, wherein the mask material is removed through a cleaning process using n-hexane.

* * * * *